(12) United States Patent
Abe et al.

(10) Patent No.: US 7,901,045 B2
(45) Date of Patent: Mar. 8, 2011

(54) INK JET RECORDING HEAD AND METHOD FOR MANUFACTURING THE SAME

(75) Inventors: Kazuya Abe, Oita (JP); Kenji Ono, Tokyo (JP); Toshiyasu Sakai, Kawasaki (JP); Hiroyuki Abo, Chigasaki (JP); Noriyasu Ozaki, Atsugi (JP); Mitsuru Chida, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 563 days.

(21) Appl. No.: 12/022,741

(22) Filed: Jan. 30, 2008

(65) Prior Publication Data

US 2008/0180487 A1    Jul. 31, 2008

(30) Foreign Application Priority Data

Jan. 31, 2007  (JP) ................. 2007-020943

(51) Int. Cl.
*B41J 2/14* (2006.01)
*H01L 23/488* (2006.01)
(52) U.S. Cl. .......................... 347/50; 257/737
(58) Field of Classification Search .............. 347/50; 257/737
See application file for complete search history.

(56) References Cited

U.S. PATENT DOCUMENTS 5,757,078 A * 5/1998 Matsuda et al. ............ 257/737
6,629,755 B2 * 10/2003 Saito et al. .................... 347/58

FOREIGN PATENT DOCUMENTS

JP       2004-296497       10/2004

* cited by examiner

*Primary Examiner* — Jerry T Rahll
(74) *Attorney, Agent, or Firm* — Canon USA Inc IP Div

(57) ABSTRACT

The present invention provides an ink jet recording head which includes a substrate, an energy generating element which is disposed on the substrate and generates energy for discharging a liquid, an electrode which is disposed on the substrate and is electrically connected to the energy generating element, a passage-forming member which is disposed on the substrate, an adhesion layer which is disposed on the substrate and facilitates adhesion between the passage-forming member and the substrate, and a bump disposed on the electrode. The area of an upper surface of the bump is larger than the area of a lower surface of the bump, the lower surface being located on the substrate side, the upper surface being located opposite the lower surface, and a side face of the bump is covered with the adhesion layer. Thereby, a protective film is formed around the bump.

8 Claims, 7 Drawing Sheets

INK JET RECORDING HEAD AND METHOD FOR MANUFACTURING THE SAME

BACKGROUND OF THE INVENTION

1. Field of the Invention

The present invention relates to an ink jet recording head and a method for manufacturing the same, and more particularly, relates to a structure of an electrical connecting portion for supplying electrical power and electrical signals to an ink jet recording head.

2. Description of the Related Art

A method in which electrodes on the surface of a semiconductor substrate and electrodes on the surface of a mounting board are connected with bumps is known and referred to as a "flip chip method". Since high-density mounting is made possible by the flip chip method, this method is considered to be effective for electrical connection of semiconductor substrates, the number of input/output terminals of which has been increasing, and which have tended to be miniaturized in recent years.

A typical known process for forming a bump will be described below with reference to FIGS. 7A to 7H.

(1) An insulating film 203 is formed over a semiconductor substrate 201 on which an electrode pad 202 composed of aluminum is disposed such that a portion of the electrode pad 202 is exposed (FIG. 7A). The exposed portion of the electrode pad 202 corresponds to a bump-forming portion.

(2) A high-melting-point metal layer 204 is formed on the entire surface of the semiconductor substrate 201 so as to cover the exposed electrode 202 in order to improve the adhesion between the electrode 202 and a bump to be formed (FIG. 7B).

(3) A plating conductive layer 205 is formed thereon (FIG. 7C).

(4) A photosensitive resin layer 206 is formed further thereon (FIG. 7D).

(5) In order to form a bump 207, the photosensitive resin layer 206 is subjected to patterning to provide a hole in a portion of the photosensitive resin layer 206 where the bump 207 is to be formed (FIG. 7E).

(6) The bump 207 is formed by electrolytic plating in the hole defined in the photosensitive resin layer 206 (FIG. 7F).

(7) The unwanted photosensitive resin layer 206 is removed (FIG. 7G).

(8) The plating conductive layer 205 and the high-melting-point metal layer 204 remaining around the bump 207 are removed by dissolution with a solvent (FIG. 7H).

In a head substrate used for an ink jet recording head, a gold bump is used as the bump 207. The periphery of the gold bump is desirably covered with a protective film for the reasons described below. Firstly, the protective film is provided in order to prevent the high-melting-point metal layer 204 under the bump 207 from becoming brittle due to side etching which may occur in the step (8) in the bump formation process described above in which the high-melting-point metal layer 204 is removed with the solvent. Secondly, the protective film is provided in order to take measures to a possible problem in which ink reaches an electrode wiring layer located under the bump 207 to cause corrosion depending on an ink material which will be newly developed or the compositional ratio of the material.

In order to solve the problems described above, a bump formation process in which the periphery of the side face of a bump is covered with a photosensitive resin layer is known (refer to Japanese Patent Laid-Open No. 2004-296497). However, in the bump formation process described in the laid-open publication, the step (7) in the bump formation process described above must be changed to a step in which, while allowing a portion of the photosensitive resin layer 206 serving as a protective film in contact with the periphery of the side face of the bump 207 to remain, only the unwanted portion of the photosensitive resin layer 206 is removed. Specifically, an additional step is required in which a resist material is applied to mask the bump 207 and a portion of photosensitive resin layer 206 serving as a protective film, and the resist material is subjected to patterning, exposure, and development. As described above, when the existing bump protection technique is applied to the known method for manufacturing an ink jet recording head, the total number of manufacturing steps is increased, which is a problem.

SUMMARY OF THE INVENTION

The present invention provides an ink jet recording head in which a protective film can be formed around a bump without adding a special step to the known method for manufacturing an ink jet recording head.

According to an aspect of the present invention, an ink jet recording head includes a substrate, an energy generating element which is disposed on the substrate and generates energy for discharging a liquid, an electrode which is disposed on the substrate and is electrically connected to the energy generating element, a passage-forming member which is disposed on the substrate, an adhesion layer which is disposed on the substrate and improves adhesion between the passage-forming member and the substrate, and a bump disposed on the electrode. The area of an upper surface of the bump is larger than the area of a lower surface of the bump, the lower surface being located on the substrate side, the upper surface being located opposite the lower surface, and a side face of the bump is covered with the adhesion layer.

Further features of the present invention will become apparent from the following description of exemplary embodiments with reference to the attached drawings.

BRIEF DESCRIPTION OF THE DRAWINGS

FIGS. 3A-1 to 3A-7 and 3B-1 to 3B-7 are schematic cross-sectional views showing an example of a process for fabricating a head substrate of an ink jet recording head according to the embodiment of the present invention.

FIGS. 4A-1 to 4A-6 and 4B-1 to 4B-6 are schematic cross-sectional views showing a fabrication process subsequent to the fabrication process shown in FIGS. 3A-1 to 3A-7 and 3B-1 to 3B-7.

FIGS. 5A-1 to 5A-7 and 5B-1 to 5B-7 are schematic cross-sectional views showing an example of a process for fabricating a head substrate of an ink jet recording head according to another embodiment of the present invention.

FIGS. 6A-1 to 6A-6 and 6B-1 to 6B-6 are schematic cross-sectional views showing a fabrication process subsequent to the fabrication process shown in FIGS. 5A-1 to 5A-7 and 5B-1 to 5B-7.

DESCRIPTION OF THE EMBODIMENTS

First Embodiment

An example of an ink jet recording head according to a first embodiment of the present invention will be described with reference to the drawings.

Figure 1:
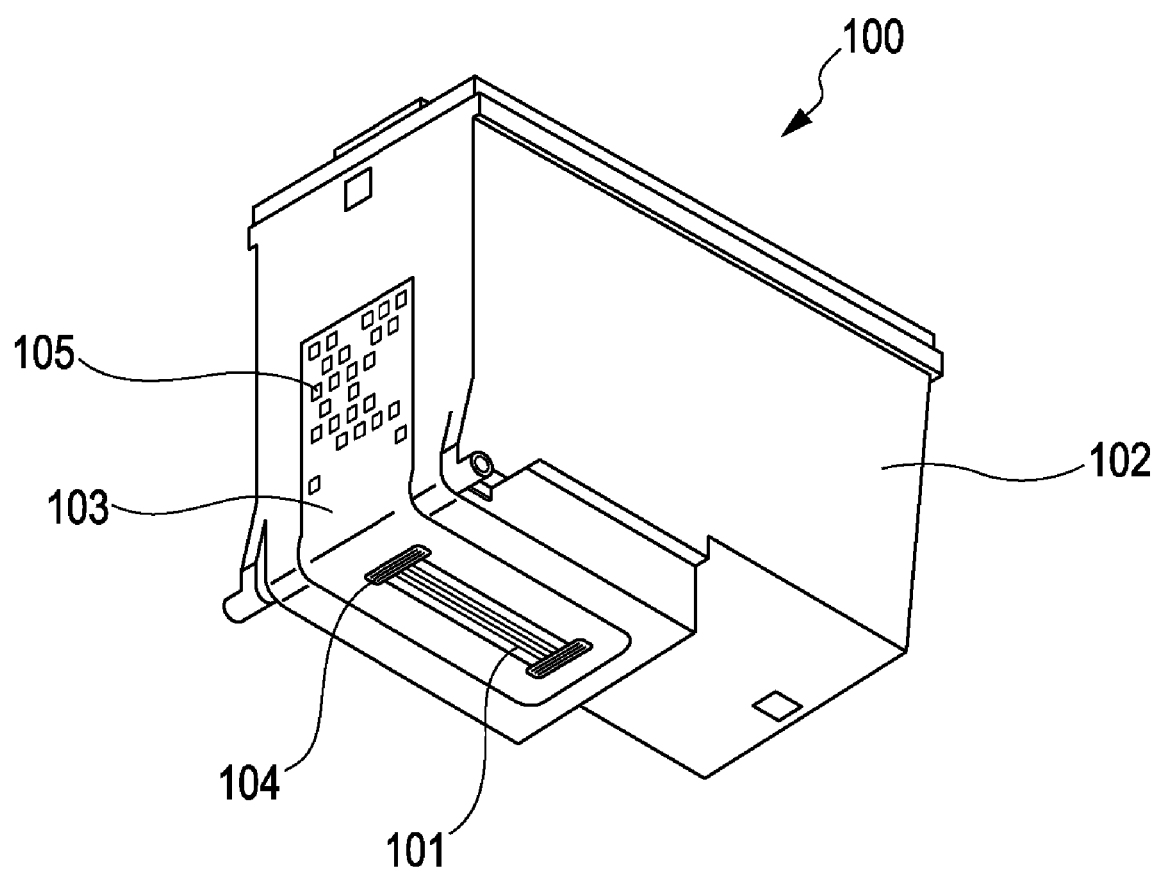
FIG. 1 is a perspective view of an example of an ink jet recording head according to an embodiment of the present invention, viewed from the bottom of the ink jet recording head.
Figure 2A:
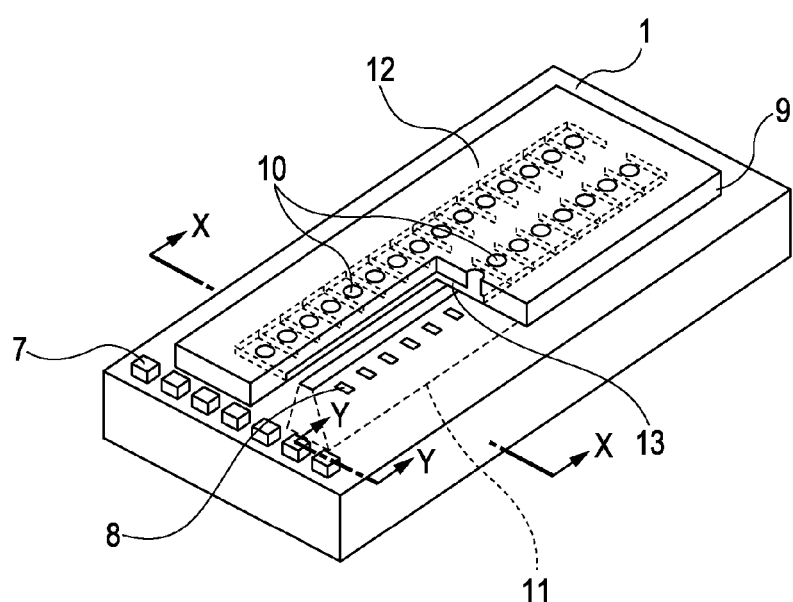
FIG. 2A is a perspective view of a head substrate shown in FIG. 1.
Figure 2B:
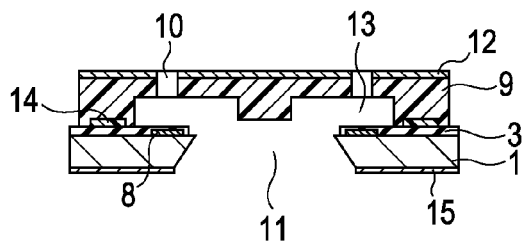
FIG. 2B is a cross-sectional view taken along the line X-X of FIG. 2A.
Figure 2C:
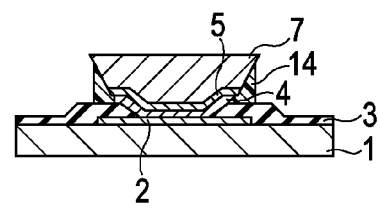
FIG. 2C is a cross-sectional view taken along the line Y-Y of FIG. 2A.

FIG. 1 is a perspective view of an example of an ink jet recording head according to the embodiment of the present invention, viewed from the bottom of the ink jet recording head. FIG. 2A is a perspective view of a head substrate shown in FIG. 1; FIG. 2B is a cross-sectional view taken along the line X-X of FIG. 2A; and FIG. 2C is a cross-sectional view taken along the line Y-Y of FIG. 2A.

As shown in FIG. 1, an ink jet recording head 100 according to this embodiment includes a head substrate 101 having discharge ports 10 each discharging a liquid, such as ink, and an ink tank member 102 which stores a liquid, such as ink, to be discharged. The ink jet recording head 100 also includes a flexible electric wiring member 103 including external connecting terminals 105 which send and receive electrical signals between external components and the head substrate 101 and supply electrical power to drive the head, and an electrical connecting portion 104 which provides electrical connection to the head substrate 101.

The head substrate 101 includes a silicon substrate 1 and a plurality of liquid discharge energy generating elements (i.e., heaters 8 serving as electric thermal conversion members which generate energy for discharging a liquid, such as ink) arrayed in two rows with a predetermined pitch on the silicon substrate 1. Furthermore, a passage-forming member 9 composed of a photosensitive resin is disposed on the silicon substrate 1, the passage-forming member 9 including a plurality of discharge ports 10 and passages 13 corresponding to the individual discharge ports 10.

A discharge port 10 is open above each heater 8. Each passage 13 communicates between an ink-supplying port 11 and the corresponding discharge port 10, the ink-supplying port 11 being placed between and below the two rows of discharge ports 10. A water-repellent layer 12 is disposed on the surface (where the discharge ports 10 are arranged) of the passage-forming member 9.

Furthermore, an adhesion layer 14 composed of a polyether amide resin is placed between the silicon substrate 1 and the passage-forming member 9, more specifically, between an insulating layer 3 composed of SiN or $SiO_2$ serving as a heater protective film disposed on the silicon substrate 1 and the passage-forming member 9. The adhesion layer 14 improves the adhesion of the passage-forming member 9 to the silicon substrate 1.

In the head substrate 101 having the structure described above, a liquid (ink) fed into each passage 13 through the ink-supplying port 11 is boiled by the corresponding heater 8, and by means of pressure generated, liquid droplets (ink droplets) are discharged from the corresponding discharge port 10.

Electrical power for driving the heaters 8 is supplied from an outside source through the flexible electric wiring member 103 and electrodes (electrode pads 2). More specifically, a bump 7 composed of gold is disposed on each electrode pad 2, and the electrode pad 2 and the electrical wiring (not shown) of the head substrate 101 are electrically connected to each other through the bump 7.

As shown in FIG. 2C, the area of an upper surface of the bump 7 is larger than the area of a lower surface of the bump 7, the lower surface being located on the silicon substrate 1 side, the upper surface being located opposite the lower surface. More specifically, the bump 7 has a reverse-tapered shape in which the width continuously increases from the lower surface to the upper surface. The side face of the bump 7 is covered with the adhesion layer 14 composed of a polyether amide resin. The coating film composed of the polyether amide resin also serves as a protective film for protecting the electrode including the bump 7.

A process for fabricating a head substrate of an ink jet recording head according to the embodiment of the present invention will be described in detail with reference to FIGS. 3A-1 to 3A-7, 3B-1 to 3B-7, 4A-1 to 4A-6, and 4B-1 to 4B-6.

FIGS. 3A-1 to 3A-7, 3B-1 to 3B-7, 4A-1 to 4A-6, and 4B-1 to 4B-6 are schematic cross-sectional views showing an example of a process for fabricating a recording head substrate shown in FIG. 2A. More specifically, FIGS. 3A-1 to 3A-7 and 4A-1 to 4A-6 each correspond to a part of a cross-sectional view taken along the line X-X of FIG. 2A. FIGS. 3B-1 to 3B-7 and 4B-1 to 4B-6 each correspond to a part of a cross-sectional view taken along the line Y-Y of FIG. 2A.

Figures 1, 3A:
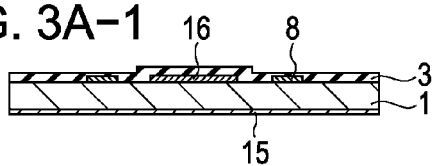

As shown in FIG. 3A-1, a plurality of heaters 8 are disposed on the front surface of a silicon substrate 1. The back surface of the silicon substrate 1 is entirely covered with a $SiO_2$ film 15. A sacrificial layer 16 is formed between the rows of the heaters 8 on the front surface of the silicon substrate 1. The sacrificial layer 16 is used for improving the dimensional accuracy of an ink-supplying port 11 when the ink-supplying port 11 is formed by etching the silicon substrate 1 using an alkaline solution. Note that the wiring of the heaters 8 and the semiconductor elements constituting an electrical circuit for driving the heaters 8 are omitted in the drawings. The sacrificial layer 16 can be etched using an alkaline solution, and is composed of polysilicon, aluminum which is etched at a high etching rate, aluminum-silicon, aluminum-copper, aluminum-silicon-copper, or the like.

Figures 1, 3B:
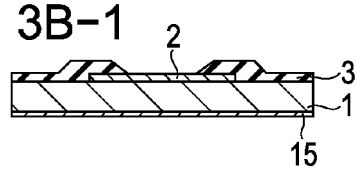

Furthermore, as shown in FIG. 3B-1, an electrode pad 2 is formed by patterning aluminum, and a portion of the electrode pad 2 is exposed outside.

Figures 2, 3A:
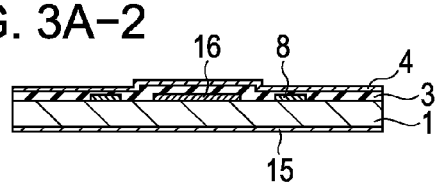
Figures 2, 3B:
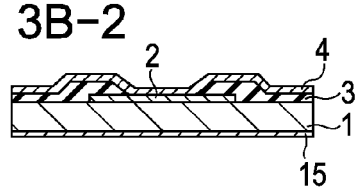

As shown in FIGS. 3A-2 and 3B-2, a titanium-tungsten layer 4 is formed over the entire surface of the silicon substrate 1 (insulating layer 3) with a vacuum deposition system, the titanium-tungsten layer 4 being a high-melting-point metal layer for improving adhesion with gold which will constitute the bump 7.

Figures 3, 3A:
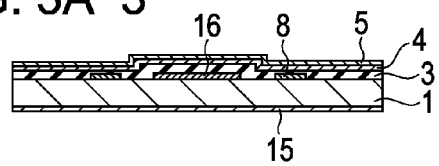
Figures 3, 3B:
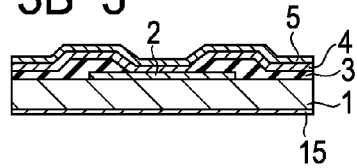

Subsequently, as shown in FIGS. 3A-3 and 3B-3, a plating conductive layer 5 is formed over the entire surface with a vacuum deposition system using gold (Au) which has excellent electrical properties as a metal for wiring.

Subsequently, as shown in FIGS. 3A-4 and 3B-4, a photosensitive resin layer 6a is formed by applying a positive photoresist by spin coating on the surface of the plating conductive layer 5 which is a metal.

Subsequently, as shown in FIGS. 3A-5 and 3B-5, the photosensitive resin layer 6a composed of the photoresist is subjected to exposure and development by photolithography. In this step, the photosensitive resin layer 6a is removed such that a predetermined region of the plating conductive layer 5 overlapping the electrode pad 2 is exposed to form a recess serving as a mold for a bump 7 which is formed by electrolytic plating. During this step, by performing proximity exposure while adjusting the gap between a mask (not shown) and the wafer, the photosensitive resin layer 6a surrounding the predetermined region is formed so as to have a tapered cross section (refer to FIG. 3B-5). Here, the tapered cross section means that in the cross section shown in FIG. 3B-5, the side faces of the opposing photosensitive resin layers 6a are inclined such that the distance between the opposing photosensitive resin layers 6a increases with the distance from the surface of the silicon substrate 1 upward. Consequently, since the photosensitive resin layer 6a serving as the mold has the tapered cross section, the bump 7 to be formed therein has a reverse-tapered shape. That is, the side face of the bump 7 is inclined such that the area of a cross section of the upper surface of the bump 7 (the cross section being taken along the surface of the silicon substrate 1) is larger than the area of the cross section of the lower surface of the bump 7 located on the silicon substrate 1 side, the upper surface being located opposite the lower surface.

Subsequently, electrolytic plating is performed in which a current is applied to the plating conductive layer 5 in an electrolytic bath containing gold sulfite, and thus the bump (gold bump) 7 is formed on the portion of the electrode pad 2 not covered with the photosensitive resin 6a. At this time, since gold is deposited along the inclined surfaces of the photosensitive resin layer 6a, the resulting gold bump 7 has a reverse-tapered shape as shown in FIGS. 3A-6 and 3B-6.

Subsequently, the silicon substrate 1 is immersed in a resist stripping solution to remove the photosensitive resin layer 6a (refer to FIGS. 3A-7 and 3B-7). Thereby, the plating conductive layer 5 located under the removed photosensitive resin layer 6a is exposed. Then, the silicon substrate 1 is immersed in an etchant containing a nitrogen-based organic compound, iodine, and potassium iodide, and the plating conductive layer 5 is removed by etching. Thereby, the titanium-tungsten layer 4, which will serve as an adhesion layer with respect to the bump 7, is exposed.

Subsequently, the silicon substrate 1 is immersed in a $H_2O_2$-based etchant, and the exposed titanium-tungsten layer 4 is removed (refer to FIG. 4B-1).

Subsequently, a polyether amide resin is applied by spin coating to the entire surface of the silicon substrate 1 provided with the heaters 8, the insulating layer 3, etc., and a photosensitive resin 6b, which is a positive resist, is further applied thereon by spin coating, followed by exposure and development. Then, patterning is performed by dry etching or the like to remove the photosensitive resin layer 6b (refer to FIGS. 4A-2 and 4B-2). Through the steps described above, an adhesion layer 14 composed of a polyether amide resin for improving the adhesion of a passage-forming member 9 to the silicon substrate 1 is formed on the surface of the silicon substrate 1. The adhesion layer 14 thus formed includes a portion which serves as a mask when an ink-supplying port 11 is formed in the later step.

Here, the gold bump 7 has a shape in which the side face is reverse-tapered and the width gradually increases from the lower side to the upper side. That is, as the distance from the surface of the silicon substrate 1 increases, the width in the direction along the surface of the silicon substrate 1 increases. Therefore, the polyether amide resin of the adhesion layer 14 covering the reverse-tapered side face of the bump 7 is prevented from exposing the reverse-tapered side face of the bump 7 due to anisotropic dry etching. Consequently, a portion of the polyether amide resin of the adhesion layer 14 remains around the gold bump 7 (refer to FIG. 4B-3). The remaining adhesion layer 14 serves as a protective film which protects the bump 7.

As the anisotropic dry etching, RIE or the like is commonly used. In such anisotropic dry etching, since etching does not substantially proceed except in a certain direction, for example, it is possible to perform etching only in a direction perpendicular to the silicon substrate 1 and to suppress etching in a direction orthogonal thereto (i.e., in a direction parallel to the silicon substrate 1). Consequently, the polyether amide resin of the adhesion layer 14 remains around the bump 7 having a reverse-tapered cross-sectional shape.

As a method for allowing the adhesion layer 14 to remain around the bump 7, a method may be mentioned in which a positive resist is patterned around the bump 7, followed by etching. However, in view of the back-end process, since the polyether amide resin should be prevented from remaining on the bump, high-precision patterning of the positive resist is required. Such a method in which the number of fabrication steps increases and high-precision patterning is required should not be employed.

Subsequently, as shown in 4A-4, a pattern-forming material (positive photosensitive resin) 17 for forming passages 13 is applied thereon by spin coating, followed by exposure, development, and patterning. Then, a coating photosensitive resin (negative photosensitive resin) as a passage-forming member 9 is applied thereon by spin coating or the like. According to need, a water-repellent layer 12 is formed by lamination of a dry film or the like on the passage-forming member 9. Discharge ports 10 are formed by subjecting the passage-forming member 9 to exposure by ultraviolet light, Deep-UV light, or the like, and development.

Figures 3, 3A, 4:
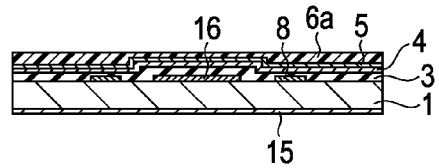
Figures 3, 3B, 4:
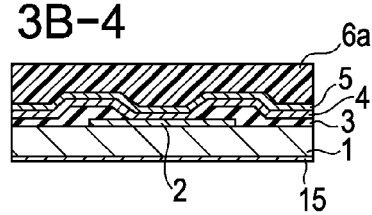
Figures 3, 3A, 4, 5:
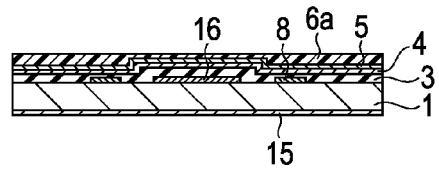
Figures 3, 3B, 4, 5:
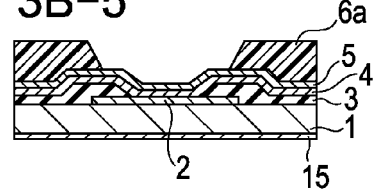
Figures 1, 4A:
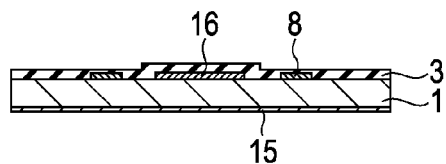
Figures 1, 4B:
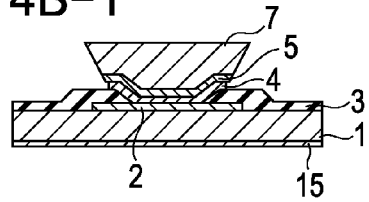
Figures 2, 4A:
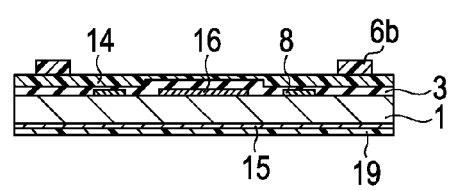
Figures 2, 4B:
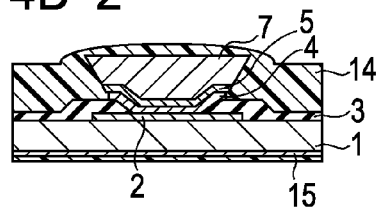
Figures 3, 4A:
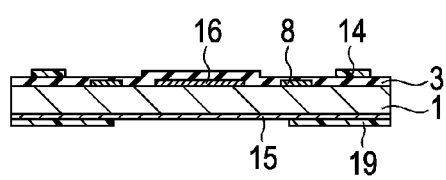
Figures 3, 4B:
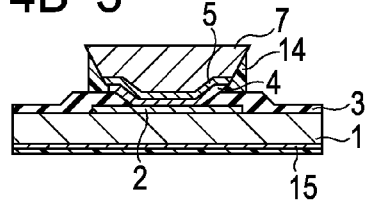
Figures 4, 4A:
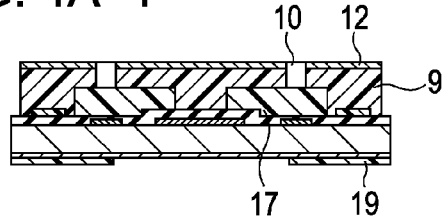
Figures 4, 4B:
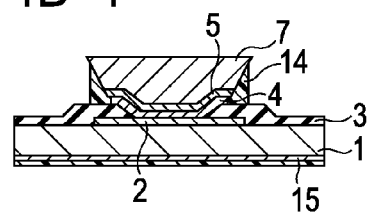
Figures 4, 4A, 5:
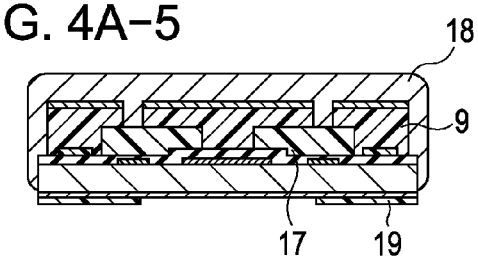
Figures 4, 4B, 5:
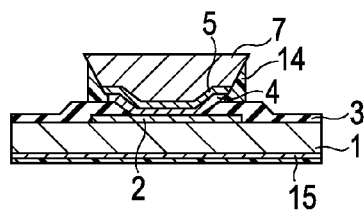
Figures 4, 4A, 5, 6:
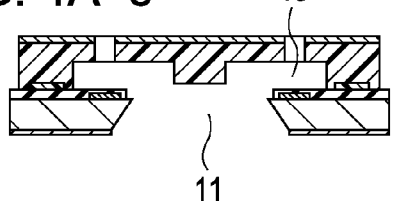
Figures 4, 4B, 5, 6:
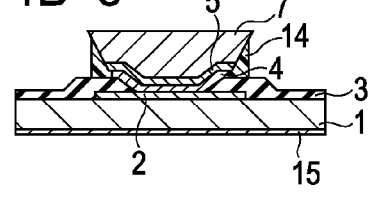

Subsequently, as shown in FIG. 4A-5, the surface and side faces of the silicon substrate 1, on which the pattern-forming material 17 and the passage-forming member 13 have been formed by patterning, are covered with a protective material 18 by spin coating or the like. The protective material 18 protects the silicon substrate 1 from being damaged due to handling during manufacturing, for example, when the silicon substrate 1 is carried into and out of a film deposition apparatus or the like. The protective material 18 is sufficiently resistant to a strong alkaline solution used when anisotropic etching is performed to form an ink-supplying port 11. Consequently, it is possible to prevent the water-repellent layer 12 and the like from being degraded by anisotropic etching. A polyether amide resin layer 19 is also formed over the entire back surface of the silicon substrate 1 when the polyether amide resin for forming the adhesion layer 14 is applied onto the front surface of the silicon substrate 1. The polyether amide resin layer 19 is formed on the back surface of the silicon substrate 1 through a $SiO_2$ film 15. The polyether amide resin layer 19 on the back surface is subjected to patterning by wet etching using a mask, and a portion in which an ink-supplying port 11 is opened by subsequent anisotropic etching is removed. The $SiO_2$ film 15 exposed from the patterned polyether amide resin layer 19 on the back surface is the first surface to be etched during the anisotropic etching.

Subsequently, as shown in FIG. 4A-6, the silicon substrate 1 is subjected to chemical etching, for example, using a strong alkaline solution, such as tetramethylammonium hydroxide (TMAH). The etching proceeds along the [100] crystalline orientation of single crystal silicon, and when the etching reaches the sacrificial layer 16 on the front surface of the silicon substrate 1, an ink-supplying port 11 is formed.

Subsequently, the polyether amide resin layer 19 on the back surface of the silicon substrate 1 is removed. Then, the pattern-forming material 17 is removed by dissolution from the ink-supplying port 11, and thereby bubbling chambers provided with passages 13 and heaters 8 are formed. Even during the fabrication steps carried out as described above, the gold bump 7 keeps the same shape as that formed by the electrolytic plating (refer to FIG. 4B-6).

The silicon substrate 1 provided with the passage-forming member 9 having discharge ports 10 through the steps described above is cut into individual chips using a dicing saw or the like. Then, an electrical connecting portion 104 for driving the heaters 8 is electrically connected to a flexible wiring member 103 to complete an ink jet recording head 100. In the case where an ink tank and an ink jet recording head are integrally formed, an ink tank member 102 which stores ink is further connected and fixed to the ink jet recording head to complete an ink jet recording head 100.

As described above in detail, when the adhesion layer 14 applied to improve the adhesion of the passage-forming member 9 to the silicon substrate 1 is removed by anisotropic etching, the adhesion layer 14 is allowed to remain at least on the lower end of the bump 7 by forming the side face of the bump 7 so as to have a reverse-tapered shape. Consequently, the lower end of the bump 7 can be protected with the adhesion layer 14 from being side-etched when unwanted portions of the titanium-tungsten layer 4 for improving the adhesion of the bump 7 to the silicon substrate 1 or the plating conductive layer 5 are removed by dissolution.

Second Embodiment

An example of an ink jet recording head according to a second embodiment will be described with reference to the drawings.

Here, another method for allowing the adhesion layer 14 as a protective film to remain around the bump 7 will be described with reference to FIGS. 5A-1 to 5A-7, 5B-1 to 5B-7, 6A-1 to 6A-6, and 6B-1 to 6B-6.

FIGS. 5A-1 to 5A-7, 5B-1 to 5B-7, 6A-1 to 6A-6, and 6B-1 to 6B-6 are schematic cross-sectional views showing another example of a process for fabricating a head substrate of an ink jet recording head according to the embodiment of the present invention, the fabrication process being different from that described in the first embodiment. More specifically, FIGS. 5A-1 to 5A-7 and 6A-1 to 6A-6 each correspond to a part of a cross-sectional view taken along the line X-X of FIG. 2A. FIGS. 5B-1 to 5B-7 and 6B-1 to 6B-6 each correspond to a part of a cross-sectional view taken along the line Y-Y of FIG. 2A.

The fabrication steps shown in FIGS. 5A-1 to 5A-7 and 6A-1 to 6A-6 are the same as the steps described in the first embodiment with reference to FIGS. 3A-1 to 3A-7 and 4A-1 to 4A-6, and thus description thereof will be omitted.

Figures 1, 5A:
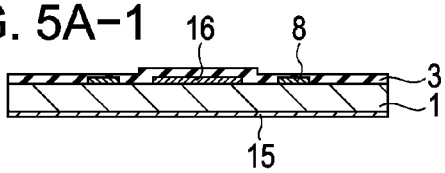
Figures 1, 5B:
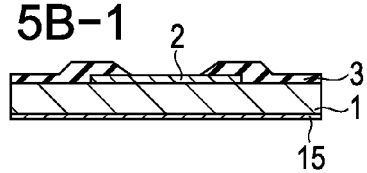
Figures 2, 5A:
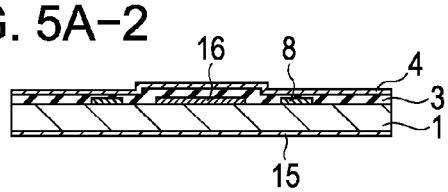
Figures 2, 5B:
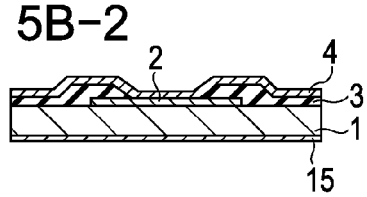
Figures 3, 5A:
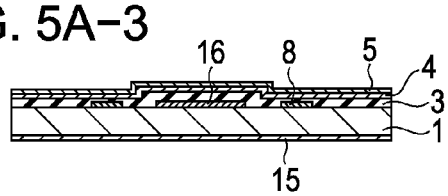
Figures 3, 5B:
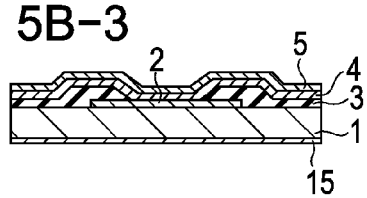
Figures 4, 5A:
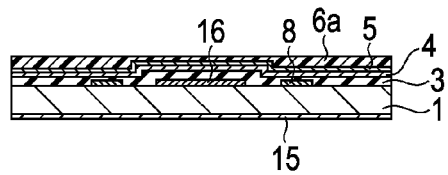
Figures 4, 5B:
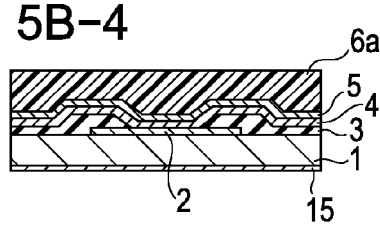
Figures 5, 5A:
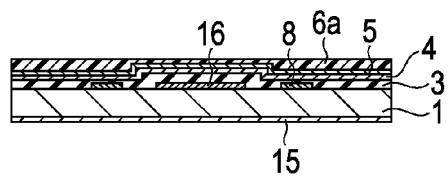
Figures 5, 5B:
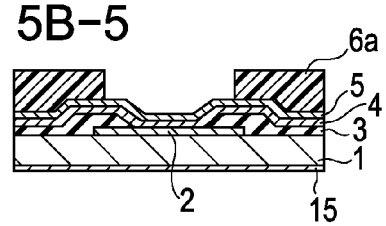
Figures 5, 5A, 6:
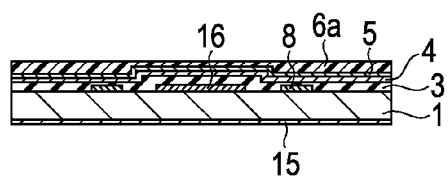
Figures 5, 5B, 6:
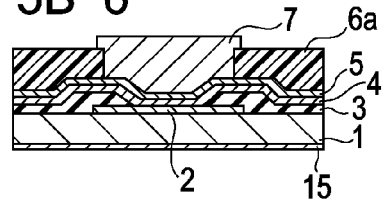
Figures 5, 5A, 6, 7:
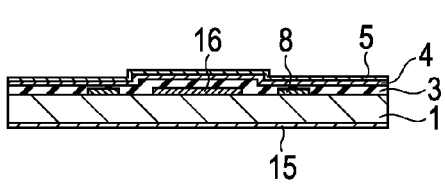
Figures 5, 5B, 6, 7:
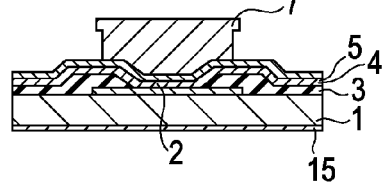
Figures 1, 6A:
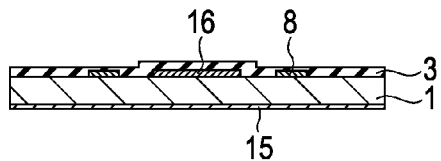
Figures 2, 6A:
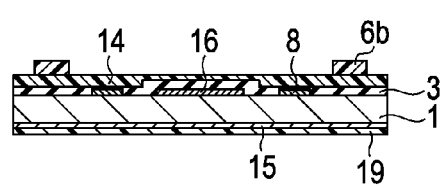
Figures 3, 6A:
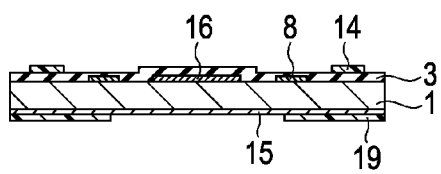
Figures 4, 6A:
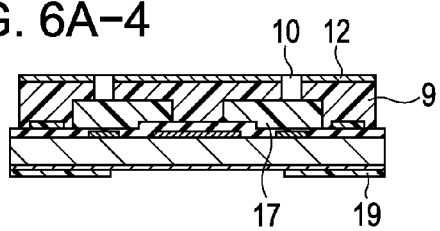
Figures 5, 6A:
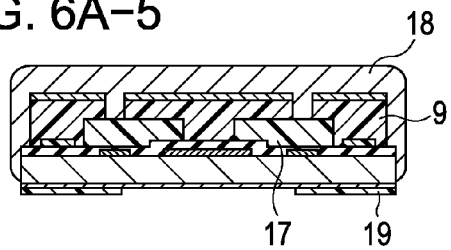
Figures 6, 6A:
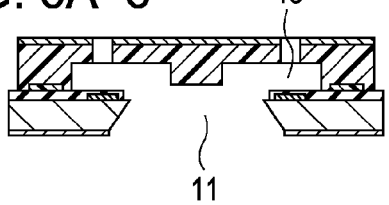
Figures 1, 6B:
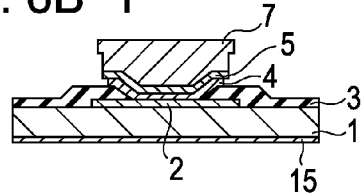
Figures 2, 6B:
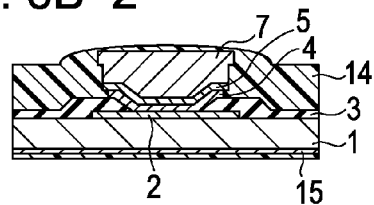
Figures 3, 6B:
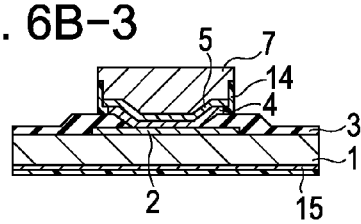
Figures 4, 6B:
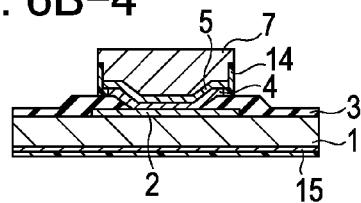
Figures 5, 6B:
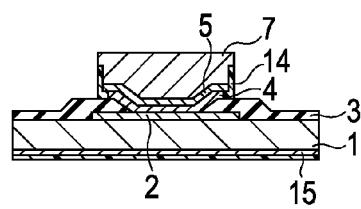
Figures 6, 6B:
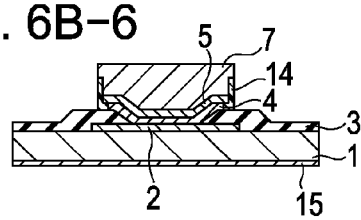
Figure 7A:
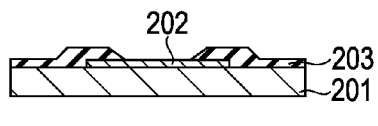
FIGS. 7A to 7H are schematic cross-sectional views showing a typical known process for forming a bump.
Figure 7B:
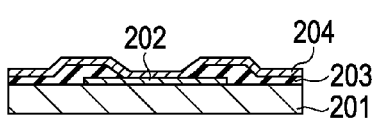
Figure 7C:
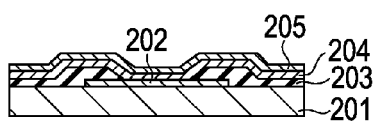
Figure 7D:
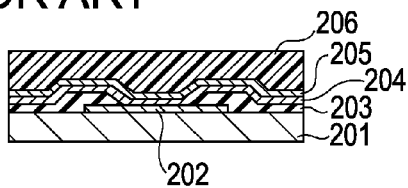
Figure 7E:
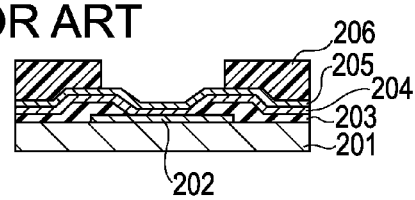
Figure 7F:
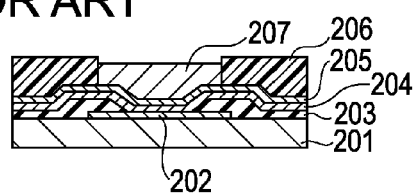
Figure 7G:
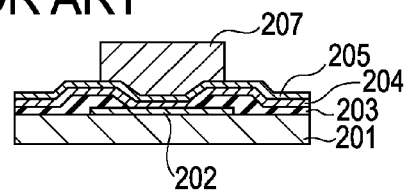
Figure 7H:
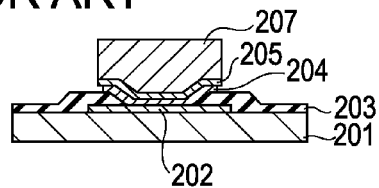

Furthermore, the fabrication steps shown in FIGS. 5B-1 to 5B-4 are the same as the steps described in the first embodiment with reference to FIGS. 3B-1 to 3B-4, and thus description thereof will be omitted.

In the step shown in FIG. 5B-5, a photosensitive resin layer 6a, which is a photoresist, is subjected to exposure and development by photolithography. In this step, the photosensitive resin layer 6a is removed such that a predetermined region of the plating conductive layer 5 overlapping the electrode pad 2 is exposed to form a recess. The recess serves as a mold for a bump 7 which is formed by electrolytic plating. In the step shown in FIG. 3B-5 in the first embodiment, a recess having a tapered side face is formed in the photosensitive resin layer 6a. In contrast, in the step shown in FIG. 5B-5, a recess having a substantially perpendicular side face with respect to the surface of the silicon substrate 1 is formed in the photosensitive resin layer 6a.

Figures 3, 3A, 4, 5, 6:
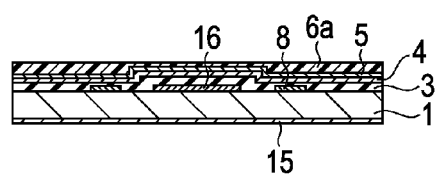
Figures 3, 3B, 4, 5, 6:
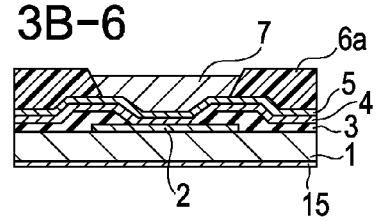
Figures 3, 3A, 4, 5, 6, 7:
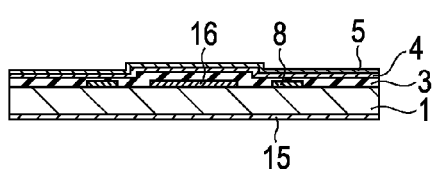
Figures 3, 3B, 4, 5, 6, 7:
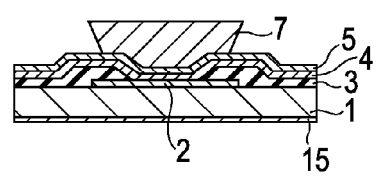

Subsequently, in the step shown in FIG. 5B-6, electrolytic plating is performed in which a current is applied to the plating conductive layer 5 in an electrolytic bath containing gold sulfite. Thus, a bump (gold bump) 7 is formed on the portion of the electrode pad 2 not covered with the photosensitive resin 6a. At this time, gold for forming the bump is deposited on the portion of the electrode pad 2 not covered with the photosensitive resin 6a higher than the thickness of the photosensitive resin layer 6a such that the resulting bump 7 protrudes from the surface of the photosensitive resin layer 6a. The gold protruding from the surface of the photosensitive resin layer 6a is spread and deposited on the surface of the photosensitive resin layer 6a. The bump 7 thus formed has a stepped shape in which the width increases stepwise between the lower surface of the bump along the surface of the silicon substrate 1 and the upper surface of the bump.

The subsequent fabrication steps shown in FIGS. 5B-7 and 6B-1 to 6B-6 are the same as the steps described in the first embodiment with reference to FIGS. 3B-7 and 4B-1 to 4B-6, except that there is a difference in the shape of the side face of the bump 7. Specifically, in the first embodiment, the side face of the bump 7 is reverse-tapered, while, in this embodiment, the bump 7 has a stepped shape in which the upper portion away from the surface of the silicon substrate 1 has a larger cross section.

In this embodiment, the area of the top of the bump 7 is larger than the area of the lower portion of the bump 7. Consequently, the side face of the bump 7 is prevented from being etched by anisotropic dry etching, and a portion of the adhesion layer 14 formed for improving the adhesion of the passage-forming member 9 to the silicon substrate 1 remains around the bump 7 and serves as a protective film (refer to FIG. 6B-3).

The silicon substrate 1 provided with the passage-forming member 9 having discharge ports 10 through the steps described above is cut into individual chips using a dicing saw or the like. Then, an electrical connecting portion 104 for driving the heaters 8 is electrically connected to a flexible wiring member 103 to complete an ink jet recording head 100. In the case where an ink tank and an ink jet recording head are integrally formed, an ink tank member 102 which stores ink is further connected and fixed to the ink jet recording head to complete an ink jet recording head 100.

As described above, in this embodiment, the bump 7 has a stepped shape in which the cross-sectional area of the upper portion is larger than that of the lower portion. In this embodiment, the stepped shape includes one step. However, two or more steps may be included. As long as the cross-sectional area of the lowest portion is the smallest, it is possible to protect the bump 7 from being side-etched. By using such a structure, when the adhesion layer 14 applied to improve the adhesion of the passage-forming member 9 to the silicon substrate 1 is removed by anisotropic etching, the adhesion layer 14 is allowed to remain on the side face of the lower portion of the stepped-shaped bump 7. Consequently, the lower end of the bump 7 can be protected with the adhesion layer 14 from being side-etched when unwanted portions of the titanium-tungsten layer 4 for improving the adhesion of the bump 7 to the silicon substrate 1 or the plating conductive layer 5 are removed by dissolution. In comparison with the first embodiment, it is easy to form the bump 7 so as to have a desired shape.

While the present invention has been described with reference to exemplary embodiments, it is to be understood that the invention is not limited to the disclosed exemplary embodiments. The scope of the following claims is to be accorded the broadest interpretation so as to encompass all modifications, equivalent structures and functions.

This application claims the benefit of Japanese Application No. 2007-020943 filed Jan. 31, 2007, which is hereby incorporated by reference herein in its entirety.

What is claimed is:

1. An ink jet recording head comprising:
a substrate;
an energy generating element disposed on the substrate and configured to generate energy for discharging a liquid;
an electrode disposed on the substrate and electrically connected to the energy generating element;
a passage-forming member disposed on the substrate;
an adhesion layer disposed on the substrate and facilitating adhesion between the passage-forming member and the substrate; and
a bump disposed on the electrode,
wherein an area of an upper surface of the bump is larger than an area of a lower surface of the bump, the lower surface being located on the substrate side, the upper surface being located opposite the lower surface, and a side face of the bump is covered with the adhesion layer.

2. The ink jet recording head according to claim 1, wherein the bump has a reverse-tapered shape in which the width continuously increases from the lower surface to the upper surface.

3. The ink jet recording head according to claim 1, wherein the bump has a stepped shape in which the width increases stepwise at least once between the lower surface and the upper surface.

4. The ink jet recording head according to claim 1, wherein the adhesion layer is composed of a polyether amide resin.

5. A method for manufacturing the ink jet recording head according to claim 1, the method comprising:
forming the electrode on a surface of the substrate;
forming a plating conductive layer on the surface of the substrate including a surface of the electrode;
applying a photosensitive resin onto the plating conductive layer to form a photosensitive resin layer;
subjecting the photosensitive resin layer to exposure and development such that a region of the plating conductive layer overlapping the electrode is exposed and the photosensitive resin layer surrounding the region has a tapered cross section in which the distance between opposing photosensitive resin layers increases with the distance from the surface of the substrate;
forming the bump by electrolytic plating on the region;
removing the photosensitive resin layer and the plating conductive layer;
forming the adhesion layer so as to cover the bump; and
subjecting the adhesion layer to anisotropic dry etching.

6. The method according to claim 5, wherein the adhesion layer is composed of a polyether amide resin.

7. A method for manufacturing the ink jet recording head according to claim 1, the method comprising:
forming the electrode on a surface of the substrate;
forming a plating conductive layer on the surface of the substrate including a surface of the electrode;
applying a photosensitive resin onto the plating conductive layer to form a photosensitive resin layer;
subjecting the photosensitive resin layer to exposure and development such that a region of the plating conductive layer overlapping the electrode is exposed;
forming the bump by electrolytic plating on the region so as to be higher than the thickness of the photosensitive resin layer and to be deposited on the surface of the photosensitive resin layer;
removing the photosensitive resin layer and the plating conductive layer;
forming the adhesion layer so as to cover the bump; and
subjecting the adhesion layer to anisotropic dry etching.

8. The method according to claim 7, wherein the adhesion layer is composed of a polyether amide resin.

* * * * *